United States Patent
Lau et al.

(10) Patent No.: US 12,412,879 B2
(45) Date of Patent: Sep. 9, 2025

(54) PACKAGE STRUCTURE AND MANUFACTURING METHOD THEREOF

(71) Applicant: Unimicron Technology Corp., Taoyuan (TW)

(72) Inventors: John Hon-Shing Lau, Taoyuan (TW); Tzyy-Jang Tseng, Taoyuan (TW)

(73) Assignee: Unimicron Technology Corp., Taoyuan (TW)

(*) Notice: Subject to any disclaimer, the term of this patent is extended or adjusted under 35 U.S.C. 154(b) by 185 days.

(21) Appl. No.: 18/331,943

(22) Filed: Jun. 9, 2023

(65) Prior Publication Data

US 2023/0402441 A1  Dec. 14, 2023

Related U.S. Application Data

(63) Continuation-in-part of application No. 17/835,990, filed on Jun. 9, 2022, now Pat. No. 11,860,428.

(51) Int. Cl.
*H01L 25/16* (2023.01)
*G02B 6/42* (2006.01)
(Continued)

(52) U.S. Cl.
CPC ............ *H01L 25/167* (2013.01); *G02B 6/4271* (2013.01); *H01L 23/36* (2013.01);
(Continued)

(58) Field of Classification Search
None
See application file for complete search history.

(56) References Cited

U.S. PATENT DOCUMENTS 8,404,501 B2 * 3/2013 Huang ................ G02B 6/4249
257/E33.056
9,781,863 B1 * 10/2017 Kim ...................... H01L 23/053
(Continued)

FOREIGN PATENT DOCUMENTS

TW          201841392          11/2018
TW          202322303          6/2023
(Continued)

OTHER PUBLICATIONS

"Office Action of Taiwan Counterpart Application", issued on Jan. 8, 2024, p. 1-p. 13.
(Continued)

*Primary Examiner* — Jerry Rahll
(74) *Attorney, Agent, or Firm* — JCIPRNET

(57) ABSTRACT

A package structure includes a circuit board, a package substrate, an electronic/photonic assembly, a film redistribution layer, a heat dissipation assembly, and an optical fiber assembly. The package substrate is disposed on the circuit board and electrically connected to the circuit board. The electronic/photonic assembly includes an ASIC assembly, an EIC assembly, and a PIC assembly. The EIC assembly and the PIC assembly are stacked and disposed on the package substrate and electrically connected to the package substrate via the film redistribution layer. An orthographic projection of the EIC assembly on the film redistribution layer is overlapped with an orthographic projection of the PIC assembly on the film redistribution layer. The heat dissipation assembly is disposed on the electronic/photonic assembly. The optical fiber assembly is disposed on the package substrate and optically connected to the PIC assembly.

13 Claims, 5 Drawing Sheets

(51) Int. Cl.
  *H01L 23/00*  (2006.01)
  *H01L 23/36*  (2006.01)
  *H01L 23/38*  (2006.01)
  *H01L 23/498* (2006.01)
  *H01L 23/538* (2006.01)
  *H01L 25/00*  (2006.01)

(52) U.S. Cl.
  CPC ........ *H01L 23/38* (2013.01); *H01L 23/49816* (2013.01); *H01L 23/5383* (2013.01); *H01L 23/5386* (2013.01); *H01L 24/16* (2013.01); *H01L 24/32* (2013.01); *H01L 24/73* (2013.01); *H01L 25/50* (2013.01); *H01L 2224/16225* (2013.01); *H01L 2224/32225* (2013.01); *H01L 2224/73204* (2013.01)

(56) References Cited

U.S. PATENT DOCUMENTS

| | | | | |
|---|---|---|---|---|
| 10,319,706 | B2* | 6/2019 | Yoo | H10H 20/01335 |
| 11,107,799 | B1* | 8/2021 | Alapati | H01L 23/49827 |
| 12,092,861 | B2* | 9/2024 | Yu | G02B 6/4274 |
| 2003/0031435 | A1* | 2/2003 | Yeh | G02B 6/4249 385/88 |
| 2003/0186476 | A1* | 10/2003 | Naydenkov | G02B 6/12007 438/26 |
| 2005/0089264 | A1* | 4/2005 | Johnson | G02B 6/1221 385/52 |
| 2006/0013525 | A1* | 1/2006 | Murayama | H01S 5/02325 385/14 |
| 2012/0138961 | A1* | 6/2012 | Huang | G02B 6/4274 257/E33.056 |
| 2013/0279844 | A1* | 10/2013 | Na | G02B 6/124 438/27 |
| 2016/0085038 | A1* | 3/2016 | Decker | G02B 6/428 385/14 |
| 2018/0188448 | A1* | 7/2018 | Yim | H01L 23/3675 |
| 2018/0233496 | A1* | 8/2018 | Yoo | H01L 24/05 |
| 2018/0335588 | A1* | 11/2018 | Jou | G02B 6/4279 |
| 2019/0146166 | A1* | 5/2019 | Wang | G02B 6/4246 385/14 |
| 2020/0051899 | A1* | 2/2020 | Mallik | H01L 23/49816 |
| 2021/0074600 | A1* | 3/2021 | Jeng | H01L 21/486 |
| 2021/0096310 | A1* | 4/2021 | Chang | H01L 24/19 |
| 2021/0096311 | A1* | 4/2021 | Yu | G02B 6/12004 |
| 2021/0225824 | A1* | 7/2021 | Islam | G02B 6/4269 |
| 2022/0077656 | A1* | 3/2022 | Liang | H01S 5/187 |
| 2022/0102297 | A1* | 3/2022 | Hsu | H01L 24/32 |
| 2023/0089433 | A1* | 3/2023 | Li | G02B 6/4214 385/49 |
| 2023/0092821 | A1* | 3/2023 | Karhade | G02B 6/3897 385/14 |
| 2023/0109686 | A1* | 4/2023 | Yu | H01L 24/32 384/14 |
| 2023/0384543 | A1* | 11/2023 | Hsia | G02B 6/4245 |
| 2023/0402441 | A1* | 12/2023 | Lau | H01L 25/50 |
| 2024/0112972 | A1* | 4/2024 | Tanaka | G02B 6/4204 |
| 2024/0201439 | A1* | 6/2024 | Kuo | G02B 6/12002 |

FOREIGN PATENT DOCUMENTS

| | | |
|---|---|---|
| TW | 202322327 | 6/2023 |
| TW | 202350024 | 12/2023 |

OTHER PUBLICATIONS

Lim Teck Guan et al., "FOWLP and Si-Interposer for High-Speed Photonic Packaging", 2021 IEEE 71st Electronic Components and Technology Conference (ECTC), Jun. 1-Jul. 4, 2021, pp. 250-255.

"Office Action of Taiwan Counterpart Application", issued on Jan. 10, 2025, p. 1-p. 6.

* cited by examiner

PACKAGE STRUCTURE AND MANUFACTURING METHOD THEREOF

CROSS-REFERENCE TO RELATED APPLICATION

This application is a continuation-in-part application of and claims the priority benefit of a prior application Ser. No. 17/835,990, filed on Jun. 9, 2022. The entirety of the above-mentioned patent application is hereby incorporated by reference herein and made a part of this specification.

BACKGROUND OF THE INVENTION

Field of the Invention

The invention relates to a semiconductor structure and a manufacturing method thereof, and particularly relates to a package structure and a manufacturing method thereof.

Description of Related Art

In recent years, high-performance computing (HPC) has become more popular and widely used in advanced network and server applications, especially for artificial intelligence (AI)-related products that require high data rates, increasing bandwidth, and decreasing latency. People have more expectations and requirements for high density (HD) package substrates used in package structures including high performance computing (HPC). For example, the line width and the line spacing of the metal layer are getting smaller, and the thickness of the dielectric layer of the redistribution circuit layer is getting thinner. However, the current build-up package substrate may not meet the above requirements. Therefore, in order to meet the above requirements, the industry proposes to place an application-specific integrated circuit (ASIC) assembly, an electronic integrated circuit (EIC) assembly, and a photonic integrated circuit (PIC) assembly side-by-side on a film redistribution layer to be electrically connected to each other via the film redistribution layer. However, since the ASIC assembly, the EIC assembly, and the PIC assembly are placed side-by-side, the area of the desired film redistribution layer is larger, and the area of the package substrate cannot be reduced. Furthermore, due to of the above arrangement, the electrical transmission path is farther away, and better electrical performance may not be achieved. Moreover, the industry further proposes to add a through-silicon via (TSV)-interposer on top of a build-up package substrate, but the price of the TSV-interposer is very high.

SUMMARY OF THE INVENTION

The invention provides a package structure that may solve the issues of the prior art and has lower cost.

The invention further provides a manufacturing method of a package structure for manufacturing the above package structure.

A package structure of the invention includes a circuit board, a package substrate, an electronic/photonic assembly, a film redistribution layer (or an organic interposer), a heat dissipation assembly, and an optical fiber assembly. The package substrate is disposed on the circuit board and electrically connected to the circuit board. The electronic/photonic assembly includes an application-specific integrated circuit (ASIC) assembly, an electronic integrated circuit (EIC) assembly, and a photonic integrated circuit (PIC) assembly. The ASIC assembly is disposed on the package substrate and electrically connected to the package substrate. The EIC assembly and the PIC assembly are stacked and disposed on the package substrate and electrically connected to the package substrate. The film redistribution layer (or an organic interposer) is disposed between the EIC assembly and the PIC assembly. The EIC assembly and the PIC assembly are electrically connected to the package substrate via the film redistribution layer. An orthographic projection of the EIC assembly on the film redistribution layer is overlapped with an orthographic projection of the PIC assembly on the film redistribution layer. The heat dissipation assembly is disposed on the electronic/photonic assembly. The optical fiber assembly is disposed on the package substrate and optically connected to the PIC assembly.

In an embodiment of the invention, the PIC assembly is located between the film redistribution layer and the package substrate.

In an embodiment of the invention, the package substrate includes an accommodating groove, and a portion of the PIC assembly is located in the accommodating groove.

In an embodiment of the invention, the heat dissipation assembly includes a first heat spreader, a second heat spreader, a first thermoelectric cooling fin, and a second thermoelectric cooling fin. The first heat spreader is disposed on the ASIC assembly. The second heat spreader is disposed on the PIC assembly. The first thermoelectric cooling fin is disposed on the first heat spreader and located between the first heat spreader and the ASIC assembly. The second thermoelectric cooling fin is disposed on the second heat spreader and located between the second heat spreader and the PIC assembly.

In an embodiment of the invention, the heat dissipation assembly further includes a plurality of first thermal interface materials and a plurality of second thermal interface materials. The plurality of first thermal interface materials are respectively disposed between the first thermoelectric cooling fin and the first heat spreader, and between the first thermoelectric cooling fin and the ASIC assembly. The plurality of second thermal interface materials are respectively disposed between the second thermoelectric cooling fin and the second heat spreader, and between the second thermoelectric cooling fin and the EIC assembly.

In an embodiment of the invention, the EIC assembly is located between the film redistribution layer and the package substrate.

In an embodiment of the invention, the package substrate includes an accommodating groove, and a portion of the EIC assembly is located in the accommodating groove.

In an embodiment of the invention, the heat dissipation assembly includes a first heat spreader, a second heat spreader, a first thermoelectric cooling fin, and a second thermoelectric cooling fin. The first heat spreader is disposed on the ASIC assembly. The second heat spreader is disposed on the EIC assembly. The first thermoelectric cooling fin is disposed on the first heat spreader and located between the first heat spreader and the ASIC assembly. The second thermoelectric cooling fin is disposed on the second heat spreader and located between the second heat spreader and the EIC assembly.

In an embodiment of the invention, the heat dissipation assembly further includes a plurality of first thermal interface materials and a plurality of second thermal interface materials. The plurality of first thermal interface materials are respectively disposed between the first thermoelectric cooling fin and the first heat spreader, and between the first thermoelectric cooling fin and the ASIC assembly. The plurality of second thermal interface materials are respectively disposed between the second thermoelectric cooling fin and the second heat spreader, and between the second thermoelectric cooling fin and the PIC assembly.

In an embodiment of the invention, the package structure further includes a plurality of first conductive members, a plurality of second conductive members, and a plurality of third conductive members. The first conductive members are disposed between the package substrate and the circuit board, wherein the package substrate is electrically connected to the circuit board via the first conductive members. The second conductive members are disposed between the film redistribution layer and the package substrate, between the film redistribution layer and the PIC assembly, and between the film redistribution layer and the EIC assembly. The EIC assembly and the PIC assembly are electrically connected to the film redistribution layer via the second conductive members. The film redistribution layer is electrically connected to the package substrate via the second conductive members. The third conductive members are disposed between the ASIC assembly and the package substrate. The ASIC assembly is electrically connected to the package substrate via the third conductive members. Each of the first conductive members, each of the second conductive members, and each of the third conductive members respectively include a solder ball or a C4 bump.

In an embodiment of the invention, the package structure further includes an underfill disposed between the ASIC assembly and the package substrate and covering the third conductive members.

In an embodiment of the invention, the optical fiber assembly includes an optical fiber connector, an optical coupler, and an optical fiber cable. The optical fiber connector is disposed on the package substrate and electrically connected to the package substrate. The optical fiber cable passes through the optical fiber connector and is electrically connected to the PIC assembly via the optical coupler.

A manufacturing method of a package structure of the invention includes the following steps. A wafer bump of an ASIC assembly wafer is provided and the wafer bump of the ASIC assembly wafer is singulated into an individual ASIC assembly. An organic interposer is manufactured using a temporary glass carrier and the organic interposer is singulated into an individual organic interposer. A wafer bump of an EIC assembly wafer and a wafer bump of a PIC assembly wafer are provided and the wafer bump of the EIC assembly wafer and the wafer bump of the PIC assembly wafer are singulated into an individual EIC assembly and an individual PIC assembly. The individual EIC assembly or the individual PIC assembly is attached on the individual organic interposer carrying the temporary glass carrier. The temporary glass carrier is removed and the individual EIC assembly or the individual PIC assembly is attached to a bottom of the organic interposer, and then a copper pillar and a solder cap are electroplated. A three-dimensional stack of the ASIC assembly and the EIC assembly or the PIC assembly is connected on a package substrate with/without an accommodating groove, and then the package substrate is connected on a circuit board using a solder ball. A thermal management system is applied on the ASIC assembly and the EIC assembly or the PIC assembly.

Based on the above, in the design of the package structure of the invention, the ASIC assembly of the electronic/photonic assembly is disposed on the package substrate and electrically connected to the package substrate, and the EIC assembly and the PIC assembly of the electronic/photonic assembly are stacked and disposed on the package substrate and electrically connected to the package substrate via the film redistribution layer. Compared with the build-up package substrate or the TSV interposer in the prior art, the package structure of the invention not only meets people's expectations and requirements for a high-density package structure, but also has lower cost, high performance, and may adopt a smaller package substrate.

In order to make the aforementioned features and advantages of the disclosure more comprehensible, embodiments accompanied with figures are described in detail below.

DESCRIPTION OF THE EMBODIMENTS

The embodiments of the invention may be understood together with the drawings, and the drawings of the invention are also regarded as a part of the disclosure. It should be understood that the drawings of the invention are not drawn to scale and, in fact, the dimensions of elements may be arbitrarily expanded or reduced in order to clearly represent the features of the invention.

Figure 1:
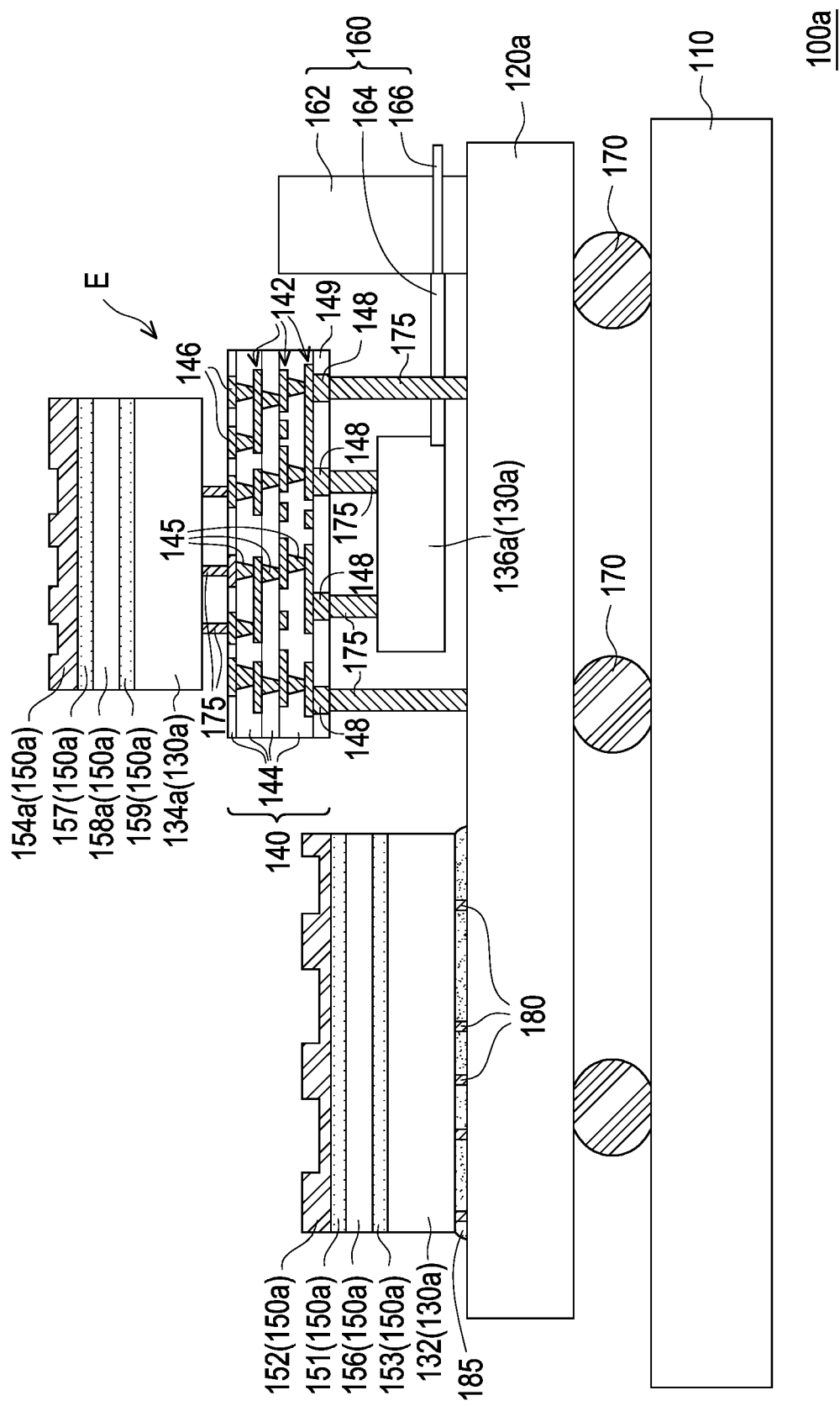
FIG. 1 is a schematic cross-sectional view of a package structure according to an embodiment of the invention.

FIG. 1 is a schematic cross-sectional view of a package structure according to an embodiment of the invention. Referring to FIG. 1, in the present embodiment, a package structure 100a includes a circuit board 110, a package substrate 120a, an electronic/photonic assembly 130a, a film redistribution layer 140, a heat dissipation assembly 150a, and an optical fiber assembly 160. The package substrate 120a is disposed on the circuit board 110 and electrically connected to the circuit board 110. The electronic/photonic assembly 130a includes an application-specific integrated circuit (ASIC) assembly 132, an electronic integrated circuit (EIC) assembly 134a, and a photonic integrated circuit (PIC) assembly 136a. The ASIC assembly 132 is disposed on the package substrate 120a and electrically connected to the package substrate 120a. The EIC assembly 134a and the PIC assembly 136a are stacked and disposed on the package substrate 120a and electrically connected to the package substrate 120a. The film redistribution layer 140 is disposed between the EIC assembly 134a and the PIC assembly 136a. The EIC assembly 134a and the PIC assembly 136a are electrically connected to the package substrate 120a via the film redistribution layer 140. The orthographic projection of the EIC assembly 134a on the film redistribution layer 140 is overlapped with the orthographic projection of the PIC assembly 136a on the film redistribution layer 140. The heat dissipation assembly 150a is disposed on the electronic/photonic assembly 130a. The optical fiber assembly 160 is disposed on the package substrate 120a and optically connected to the PIC assembly 136a. In an embodiment, an organic interposer may also be used to replace the film redistribution layer 140, which is still within the scope of the invention.

In short, the ASIC assembly 132 of the present embodiment is disposed on the package substrate 120a and electrically connected to the package substrate 120a, and the EIC assembly 134a and the PIC assembly 136a are stacked and disposed on the package substrate 120a and electrically connected to the package substrate 120a via the film redistribution layer 140. Compared with the build-up package substrate or the TSV interposer in the prior art, the package structure 100a of the present embodiment not only may meet people's expectations and requirements for high-density package structures, the cost of the film redistribution layer 140 is lower than that of the TSV interposer in the prior art, and therefore the cost may be lower, and the film redistribution layer 140 is disposed between the EIC assembly 134a and the PIC assembly 136a, thus effectively reducing the area of the package substrate 120a, so that a smaller package substrate 120a may be adopted, and better electrical performance is achieved.

Specifically, referring further to FIG. 1, in the present embodiment, the PIC assembly 136a is embodied between the film redistribution layer 140 and the package substrate 120a. The film redistribution layer 140 includes a plurality of patterned circuit layers 142, a plurality of dielectric layers 144, a plurality of first pads 146, a plurality of second pads 148, a plurality of conductive blind vias 145, and a solder resist layer 149. The patterned circuit layers 142 and the dielectric layers 144 are alternately stacked, wherein the line width and the line pitch of the patterned circuit layers 142 are both, for example, 2 micrometers, 5 micrometers, or 10 micrometers, meaning that the patterned circuit layers 142 are thin circuit layers. Preferably, the wiring density of the film redistribution layer 140 is greater than the wiring density of the package substrate 120a, and the wiring density of the package substrate 120a is greater than the wiring density of the circuit board 110. The material of the dielectric layer 144 may be, for example, organic material, glass, or ceramic, but not limited thereto. The surface of the first pads 146 is exposed and aligned with the surface of the dielectric layer 144 closest to the electronic/photonic assembly 130a. The second pads 148 are directly electrically connected to the patterned circuit layers 142, wherein the surface of the second pads 148 is exposed and aligned with the surface of the solder resist layer 149. The conductive blind vias 145 pass through the dielectric layers 144 and are electrically connected between the patterned circuit layers 142 and between the patterned circuit layers 142 and the first pads 146.

Furthermore, the heat dissipation assembly 150a of the present embodiment includes a first heat spreader 152, a second heat spreader 154a, a first thermoelectric cooling fin 156, and a second thermoelectric cooling fin 158a. The first heat spreader 152 is disposed on the ASIC assembly 132. The second heat spreader 154a is disposed on the EIC assembly 134a. The first thermoelectric cooling fin 156 is disposed on the first heat spreader 152 and located between the first heat spreader 152 and the ASIC assembly 132. The second thermoelectric cooling fin 158a is disposed on the second heat spreader 154a and located between the second heat spreader 154a and the EIC assembly 134a.

Furthermore, the heat dissipation assembly 150a of the present embodiment further includes a plurality of first thermal interface materials 151 and 153 and a plurality of second thermal interface materials 157 and 159. The first thermal interface material 151 is disposed between the first thermoelectric cooling fin 156 and the first heat spreader 152, and the first thermal interface material 153 is disposed between the first thermoelectric cooling fin 156 and the ASIC assembly 132. The second thermal interface material 157 is disposed between the second thermoelectric cooling fin 158a and the second heat spreader 154a, and the second thermal interface material 159 is disposed between the second thermoelectric cooling fin 158a and the EIC assembly 134a.

Furthermore, the package structure 100a of the present embodiment further includes a plurality of first conductive members 170, a plurality of second conductive members 175, and a plurality of third conductive members 180. The first conductive members 170 are disposed between the package substrate 120a and the circuit board 110, wherein the package substrate 120a is electrically connected to the circuit board 110 via the first conductive members 170. The second conductive members 175 are disposed between the film redistribution layer 140 and the package substrate 120a, between the film redistribution layer 140 and the PIC assembly 136a, and between the film redistribution layer 140 and the EIC assembly 134a. The EIC assembly 134a and the PIC assembly 136a are electrically connected to the film redistribution layer 140 via the second conductive members 175. The film redistribution layer 140 is electrically connected to the package substrate 120a via the second conductive members 175. The third conductive members 180 are disposed between the ASIC assembly 132 and the package substrate 120a. The ASIC assembly 132 is electrically connected to the package substrate 120a via the third conductive members 180. Each of the first conductive members 170, each of the second conductive members 175, and each of the third conductive members 180 is, for example, a solder ball or a C4 bump respectively, which is not limited here. In addition, the package structure 100a of the present embodiment further includes an underfill 185 disposed between the ASIC assembly 132 and the package substrate 120a and covering the third conductive members 180.

It should be mentioned that, since the thermal expansion coefficient of the film redistribution layer 140 is comparable to those of the package substrate 120a, the PIC assembly 136a, and the EIC assembly 134a, there is no underfill needed between the film redistribution layer 140 and the package substrate 120a, between the film redistribution layer 140 and the PIC assembly 136a, and between the film redistribution layer 140 and the EIC assembly 134a.

In addition, please refer to FIG. 1 again, the optical fiber assembly 160 of the present embodiment includes an optical fiber connector 162, an optical coupler 164, and an optical fiber cable 166. The optical fiber connector 162 is disposed on the package substrate 120a and electrically connected to the package substrate 120a. The optical fiber cable 166 passes through the optical fiber connector 162 and is electrically connected to the PIC assembly 136a via the optical coupler 164.

Figure 5:
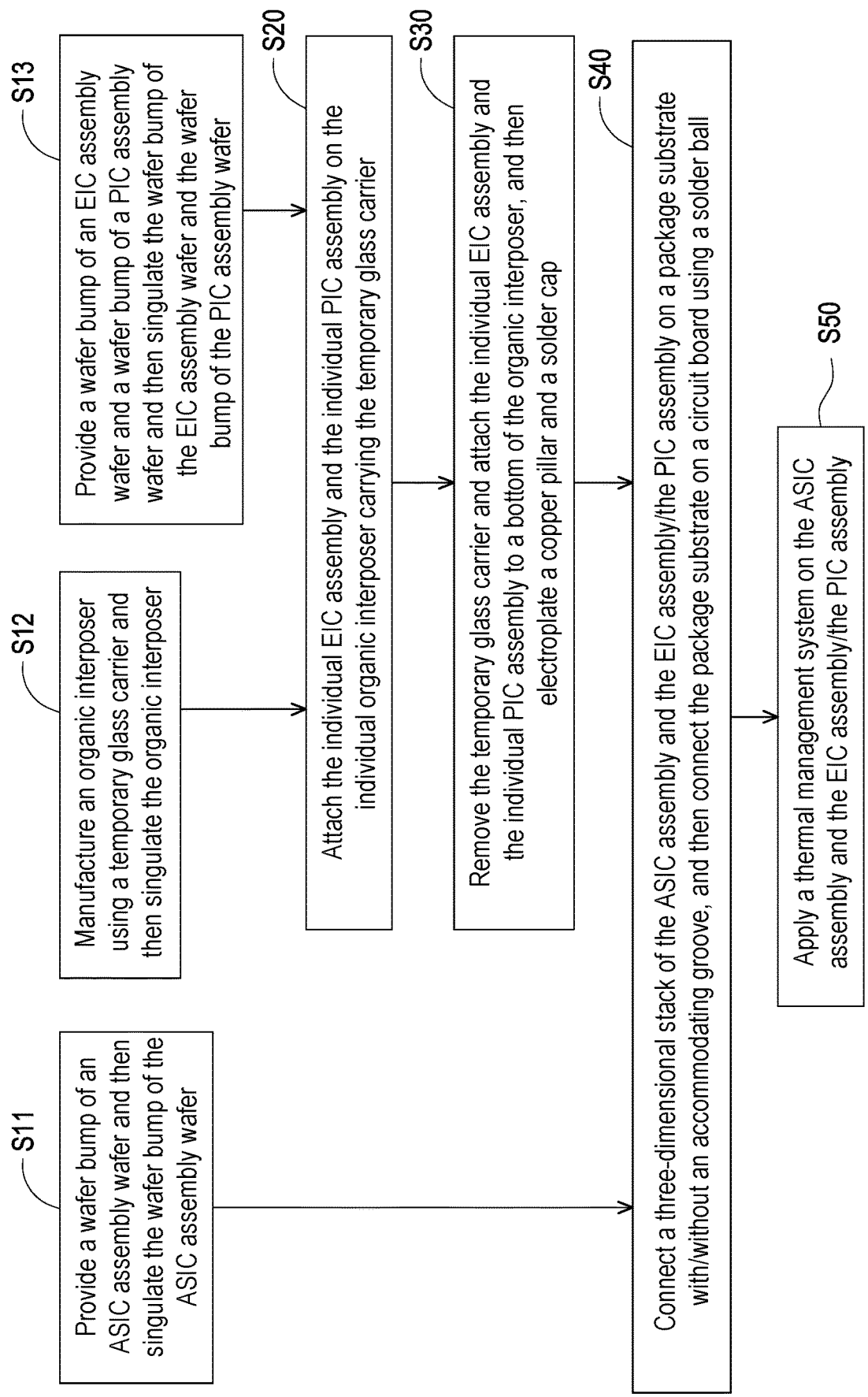
FIG. 5 is a schematic flowchart of a manufacturing method of a package structure according to an embodiment of the invention.

FIG. 5 is a schematic flowchart of a manufacturing method of a package structure according to an embodiment of the invention. Please refer to FIG. 1 and FIG. 5 at the same time. In the manufacturing process of the package structure 100a, first, step S11, a wafer bump of an ASIC assembly wafer is provided and the wafer bump of the ASIC assembly wafer is singulated into an individual ASIC assembly; step S12, an organic interposer (or a film redistribution layer) is manufactured using a temporary glass carrier and the organic interposer is singulated into an individual organic interposer; and step S13, a wafer bump of an EIC assembly wafer and a wafer bump of a PIC assembly wafer are provided and the wafer bump of the EIC assembly wafer and the wafer bump of the PIC assembly wafer are singulated into an individual EIC assembly and an individual PIC assembly. The above step S11, step S12, and step S13 are in no order.

Next, step S20, the individual EIC assembly 134a or the individual PIC assembly 136a is attached on the individual organic interposer (or the film redistribution layer 140) carrying the temporary glass carrier.

Next, step S30, the temporary glass carrier is removed and the individual EIC assembly 134a or the individual PIC assembly 136a is attached to a bottom of the organic interposer (or the film redistribution layer 140), and then a copper pillar and a solder cap are electroplated. The EIC assembly 134a and the PIC assembly 136a are respectively disposed on two opposite sides of the film redistribution layer 140 to define an electronic module E. At this time, the orthographic projection of the EIC assembly 134a on the film redistribution layer 140 is overlapped with the orthographic projection of the PIC assembly 136a on the film redistribution layer 140.

Then, step S40, a three-dimensional stack of the ASIC assembly 132 and the EIC assembly 134a or the PIC assembly 136a is connected on a package substrate 120a with/without an accommodating groove, and then the package substrate 120a is connected on the circuit board 110 using a solder ball (such as the first conductive members 170). The ASIC assembly 132 and the electronic module E are disposed on the package substrate 120a, wherein the ASIC assembly 132 and the electronic module E are respectively electrically connected to the package substrate 120a. Specifically, the ASIC assembly 132 may be bonded on the package substrate 120a and electrically connected to the package substrate 120a via the third conductive members 180 formed between the ASIC assembly 132 and the package substrate 120a, wherein each of the third conductive members 180 may be, for example, a solder ball or a C4 bump. The electronic module E may be bonded on the package substrate 120a and electrically connected to the package substrate 120a via the second conductive members 175 formed between the film redistribution layer 140 and the package substrate 120a.

Lastly, step S50, a thermal management system is applied on the ASIC assembly 132 and the EIC assembly 134a or the PIC assembly 136a. That is, the heat dissipation assembly 150a is disposed on the electronic/photonic assembly 130a. Immediately afterwards, the optical fiber assembly 160 is disposed on the package substrate 120a, wherein the optical fiber assembly 160 is optically connected to the PIC assembly 136a. At this point, the manufacture of the package structure 100a is completed.

It should be mentioned that, the embodiments below use the same reference numerals and portions of the content from previous embodiments. Specifically, the same reference numerals are used to represent the same or similar elements, and the descriptions for the same techniques are omitted. The omitted portions are as described in the embodiments above and are not repeated in the embodiments below.

Figure 2:
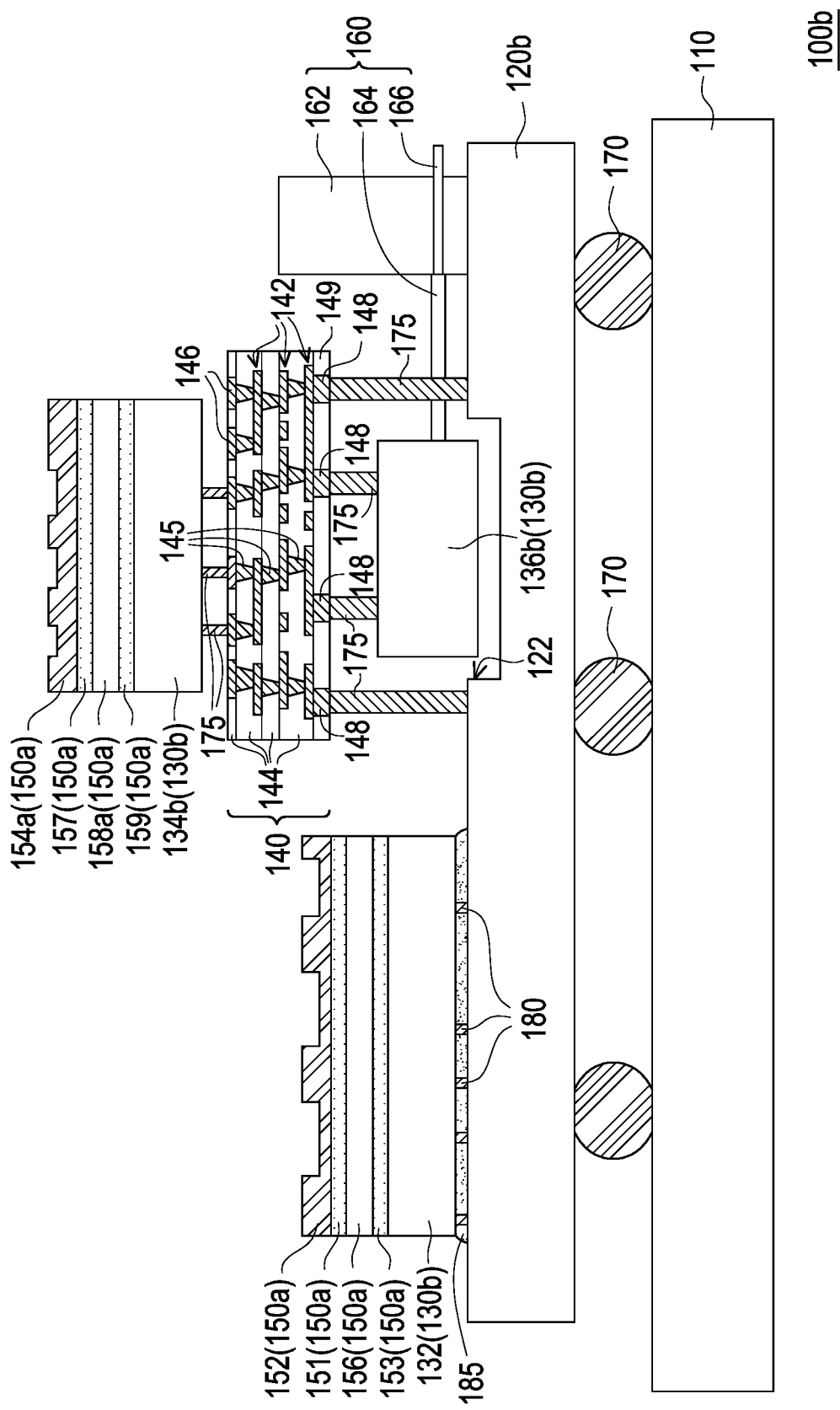
FIG. 2 is a schematic cross-sectional view of a package structure according to another embodiment of the invention.

FIG. 2 is a schematic cross-sectional view of a package structure according to another embodiment of the invention. Please refer to FIG. 1 and FIG. 2 at the same time. A package structure 100b of the present embodiment is similar to the package structure 100a of FIG. 1, and the difference between the two is: in the present embodiment, the thickness of a PIC assembly 136b is greater than the thickness of the PIC assembly 136a of the above embodiment, so a package substrate 120b may include an accommodating groove 122, and a portion of the PIC assembly 136b may be located in the accommodating groove 122. At this time, an EIC assembly 134b and the PIC assembly 136b of an electronic/photonic assembly 130b are still stacked and disposed on the package substrate 120b, and the orthographic projection of the EIC assembly 134b on the film redistribution layer 140 is completely overlapped with the orthographic projection of the PIC assembly 136b on the film redistribution layer 140.

In terms of manufacturing process, please refer to FIG. 2 and FIG. 5 at the same time. The manufacturing method of the package structure 100b of the present embodiment is similar to the manufacturing method of the package structure 100a. The difference between the two is: in the present embodiment, in step S13, the package substrate 120b formed with the accommodating groove 122 may be directly provided to correspond to the subsequent PIC assembly 136b.

Figure 3:
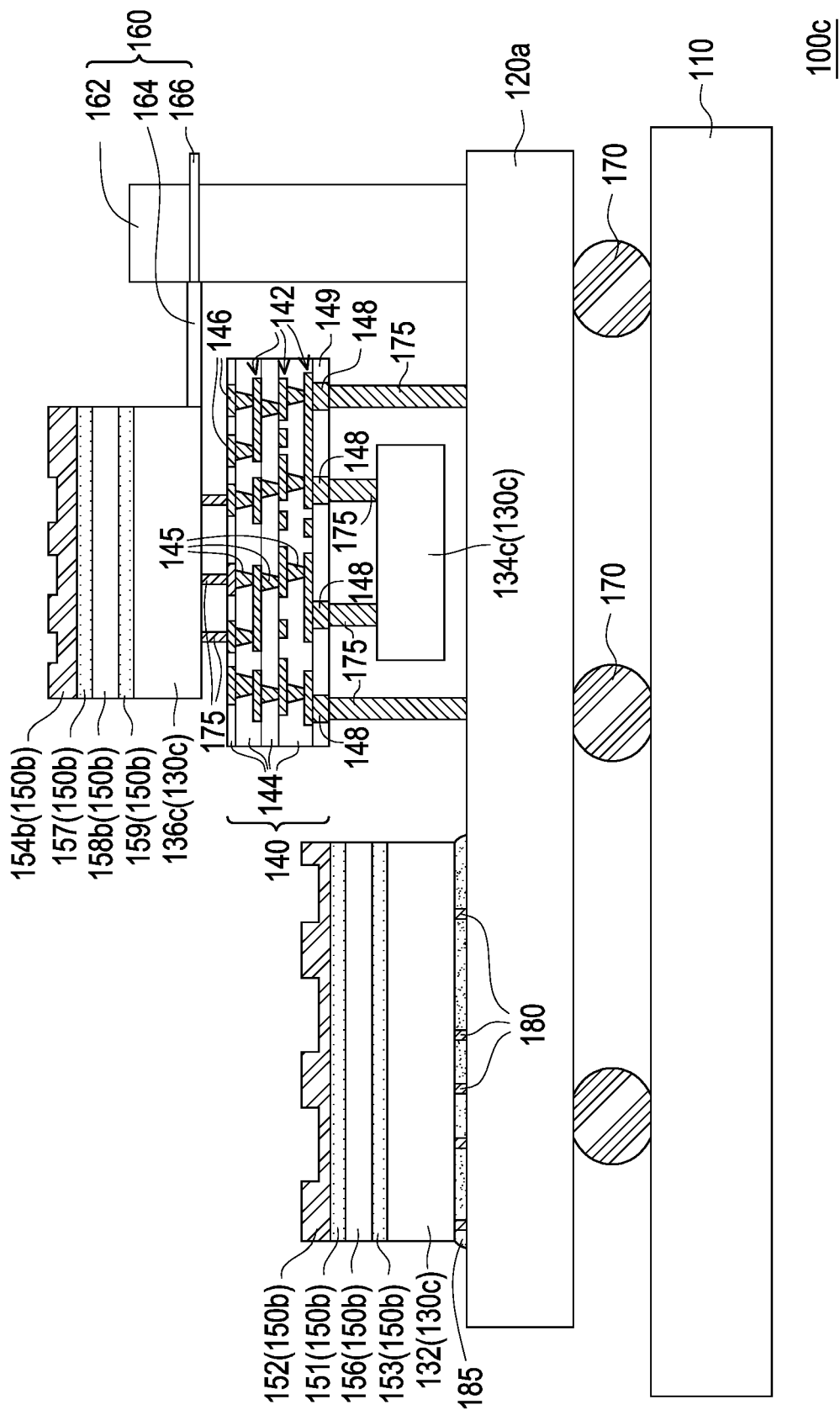
FIG. 3 is a schematic cross-sectional view of a package structure according to another embodiment of the invention.

FIG. 3 is a schematic cross-sectional view of a package structure according to another embodiment of the invention. Please refer to FIG. 1 and FIG. 3 at the same time. A package structure 100c of the present embodiment is similar to the package structure 100a of FIG. 1, and the difference between the two is: in the present embodiment, an EIC assembly 134c of an electronic/photonic assembly 130c is located between the film redistribution layer 140 and the package substrate 120a. Furthermore, a second heat spreader 154b of a heat dissipation assembly 150b is disposed on a PIC assembly 136c. A second thermoelectric cooling fin 158b of the heat dissipation assembly 150b is disposed on the second heat spreader 154b and located between the second heat spreader 154b and the PIC assembly 136c. Moreover, the second thermal interface material 157 of the heat dissipation assembly 150b is disposed between the second thermoelectric cooling fin 158b and the second heat spreader 154b, and the second thermal interface material 157 of the heat dissipation assembly 150b is disposed between the second thermoelectric cooling chip 158b and the PIC assembly 136c.

Figure 4:
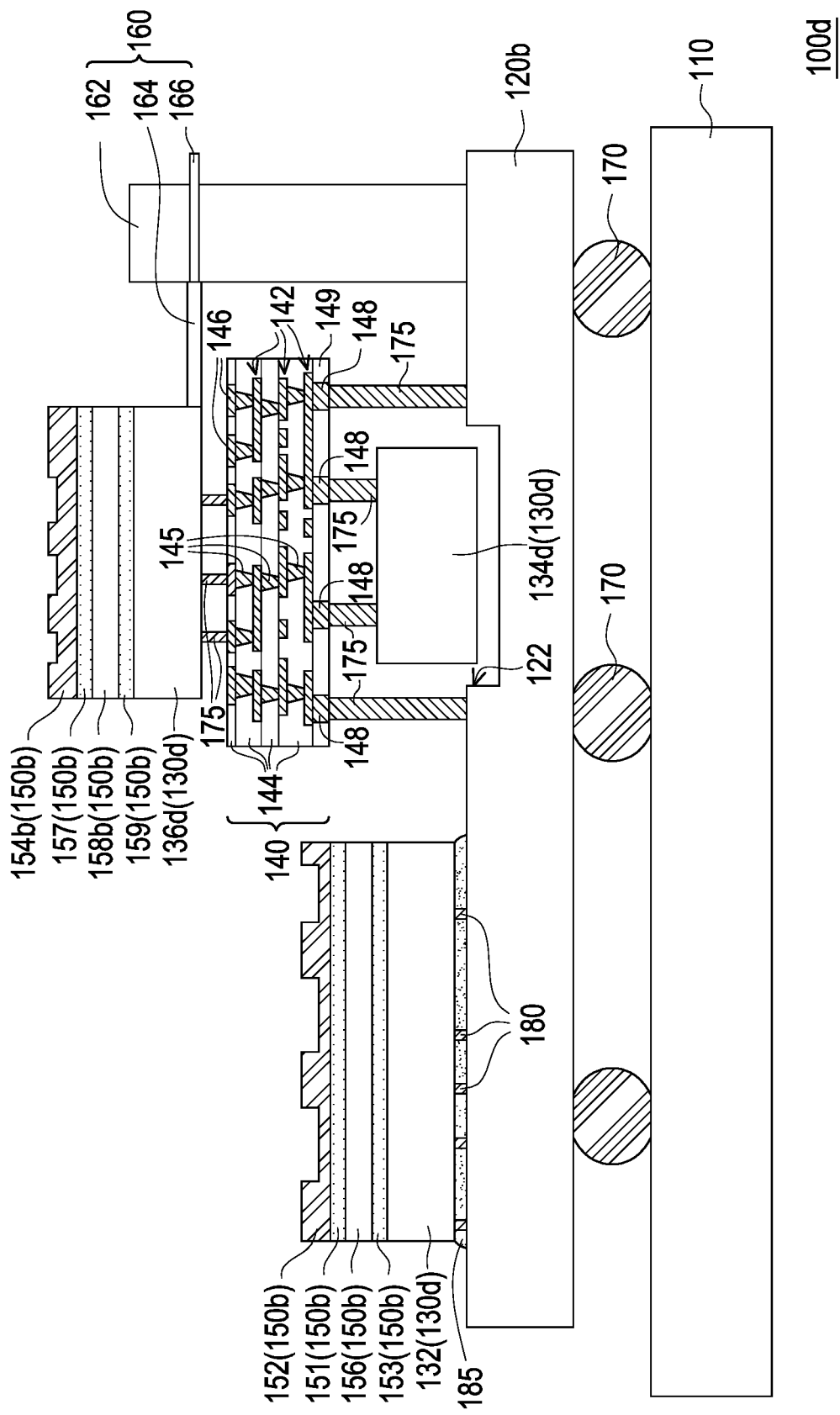
FIG. 4 is a schematic cross-sectional view of a package structure according to another embodiment of the invention.

FIG. 4 is a schematic cross-sectional view of a package structure according to another embodiment of the invention. Please refer to FIG. 3 and FIG. 4 at the same time. A package structure 100d of the present embodiment is similar to the package structure 100c of FIG. 3, and the difference between the two is: in the present embodiment, the thickness of an EIC assembly 136d is greater than the thickness of the EIC assembly 136c of the above embodiment, so the package substrate 120b may include an accommodating groove 122, and a portion of the EIC assembly 136d may be located in the accommodating groove 122. At this time, an EIC assembly 134d and the PIC assembly 136d of an electronic/photonic assembly 130d are still stacked and disposed on the package substrate 120b, and the orthographic projection of the PIC assembly 134d on the film redistribution layer 140 is completely overlapped with the orthographic projection of the EIC assembly 136d on the film redistribution layer 140.

Based on the above, in the design of the package structure of the invention, the ASIC assembly of the electronic/photonic assembly is disposed on the package substrate and electrically connected to the package substrate, and the EIC assembly and the PIC assembly of the electronic/photonic assembly are stacked and disposed on the package substrate and electrically connected to the package substrate via the film redistribution layer. Compared with the build-up package substrate or the TSV interposer in the prior art, the package structure of the invention not only meets people's expectations and requirements for a high-density package structure, but also has lower cost, high performance, and may adopt a smaller package substrate.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A package structure, comprising:
a circuit board;
a package substrate disposed on the circuit board and electrically connected to the circuit board;
an electronic/photonic assembly comprising an application specific integrated circuit (ASIC) assembly, an electronic integrated circuit (EIC) assembly, and a photonic integrated circuit (PIC) assembly, wherein the ASIC assembly is disposed on the package substrate and electrically connected to the package substrate, and the EIC assembly and the PIC assembly are stacked and disposed on the package substrate and electrically connected to the package substrate;
a film redistribution layer disposed only between the EIC assembly and the PIC assembly, wherein the EIC assembly and the PIC assembly are electrically connected to the package substrate via the film redistribution layer, and an orthographic projection of the EIC assembly on the film redistribution layer is overlapped with an orthographic projection of the PIC assembly on the film redistribution layer;
a heat dissipation assembly disposed on the electronic/photonic assembly; and
an optical fiber assembly disposed on the package substrate and optically connected to the PIC assembly.

2. The package structure of claim 1, wherein the PIC assembly is located between the film redistribution layer and the package substrate.

3. The package structure of claim 2, wherein the package substrate comprises an accommodating groove, and a portion of the PIC assembly is located in the accommodating groove.

4. The package structure of claim 2, wherein the heat dissipation assembly comprises:
a first heat spreader disposed on the ASIC assembly;
a second heat spreader disposed on the PIC assembly;
a first thermoelectric cooling fin disposed on the first heat spreader and located between the first heat spreader and the ASIC assembly; and
a second thermoelectric cooling fin disposed on the second heat spreader and located between the second heat spreader and the PIC assembly.

5. The package structure of claim 4, wherein the heat dissipation assembly further comprises:
a plurality of first thermal interface materials respectively disposed between the first thermoelectric cooling fin and the first heat spreader, and between the first thermoelectric cooling fin and the ASIC assembly; and
a plurality of second thermal interface materials respectively disposed between the second thermoelectric cooling fin and the second heat spreader, and between the second thermoelectric cooling fin and the EIC assembly.

6. The package structure of claim 1, wherein the EIC assembly is located between the film redistribution layer and the package substrate.

7. The package structure of claim 6, wherein the package substrate comprises an accommodating groove, and a portion of the EIC assembly is located in the accommodating groove.

8. The package structure of claim 6, wherein the heat dissipation assembly comprises:
a first heat spreader disposed on the ASIC assembly;
a second heat spreader disposed on the EIC assembly;
a first thermoelectric cooling fin disposed on the first heat spreader and located between the first heat spreader and the ASIC assembly; and
a second thermoelectric cooling fin disposed on the second heat spreader and located between the second heat spreader and the EIC assembly.

9. The package structure of claim 8, wherein the heat dissipation assembly further comprises:
a plurality of first thermal interface materials respectively disposed between the first thermoelectric cooling fin and the first heat spreader, and between the first thermoelectric cooling fin and the ASIC assembly; and
a plurality of second thermal interface materials respectively disposed between the second thermoelectric cooling fin and the second heat spreader, and between the second thermoelectric cooling fin and the PIC assembly.

10. The package structure of claim 1, further comprising:
a plurality of first conductive members disposed between the package substrate and the circuit board, wherein the package substrate is electrically connected to the circuit board via the first conductive members;
a plurality of second conductive members disposed between the film redistribution layer and the package substrate, between the film redistribution layer and the PIC assembly, and between the film redistribution layer and the EIC assembly, wherein the EIC assembly and the PIC assembly are electrically connected to the film redistribution layer via the second conductive members, and the film redistribution layer is electrically connected to the package substrate via the second conductive members; and
a plurality of third conductive members disposed between the ASIC assembly and the package substrate, wherein the ASIC assembly is electrically connected to the package substrate via the third conductive members, and each of the first conductive members, each of the second conductive members, and each of the third conductive members respectively comprise a solder ball or a C4 bump.

11. The package structure of claim 10, further comprising:
an underfill disposed between the ASIC assembly and the package substrate and covering the third conductive members.

12. The package structure of claim 1, wherein the optical fiber assembly comprises an optical fiber connector, an optical coupler, and an optical fiber cable, the optical fiber connector is disposed on the package substrate and electrically connected to the package substrate, and the optical fiber cable passes through the optical fiber connector and is electrically connected to the PIC assembly via the optical coupler.

13. A manufacturing method of a package structure, comprising:
providing a wafer bump of an ASIC assembly wafer and singulating the wafer bump of the ASIC assembly wafer into an individual ASIC assembly;
manufacturing an organic interposer using a temporary glass carrier and singulating the organic interposer into an individual organic interposer;
providing a wafer bump of an EIC assembly wafer and a wafer bump of a PIC assembly wafer and singulating the wafer bump of the EIC assembly wafer and the wafer bump of the PIC assembly wafer into an individual EIC assembly and an individual PIC assembly;

attaching the individual EIC assembly or the individual PIC assembly on the individual organic interposer carrying the temporary glass carrier;

removing the temporary glass carrier and attaching the individual EIC assembly or the individual PIC assembly to a bottom of the organic interposer, and then electroplating a copper pillar and a solder cap;

connecting a three-dimensional stack of the ASIC assembly and the EIC assembly or the PIC assembly on a package substrate with/without an accommodating groove, and then connecting the package substrate on a circuit board using a solder ball; and applying a thermal management system on the ASIC assembly and the EIC assembly or the PIC assembly.

* * * * *